US 6,681,351 B1

(12) United States Patent
Kittross et al.

(10) Patent No.: US 6,681,351 B1
(45) Date of Patent: Jan. 20, 2004

(54) EASY TO PROGRAM AUTOMATIC TEST EQUIPMENT

(75) Inventors: Andrew W. Kittross, Beverly, MA (US); Allan M. Ryan, Billerica, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/417,034

(22) Filed: Oct. 12, 1999

(51) Int. Cl.$^7$ .......................... G11C 29/00; G06F 19/00

(52) U.S. Cl. ...................................... 714/724; 702/119

(58) Field of Search ................................ 714/724, 742, 714/726, 741, 738; 395/704, 500, 183.01; 364/468.28, 580; 702/119; 371/22.1; 368/118

(56) References Cited

U.S. PATENT DOCUMENTS

| 5,668,745 | A | * | 9/1997 | Day ........................... 702/121 |
| 5,794,007 | A | * | 8/1998 | Arrigotti et al. ............ 714/720 |
| 5,828,674 | A | * | 10/1998 | Proskauer ................... 714/724 |
| 5,892,949 | A | * | 4/1999 | Noble ........................ 717/125 |
| 5,910,895 | A | | 6/1999 | Proskauer et al. ..... 364/468.28 |
| 5,913,022 | A | * | 6/1999 | Tinaztepe et al. ............. 714/25 |
| 5,968,192 | A | * | 10/1999 | Kornachuk et al. ......... 714/724 |
| 6,128,759 | A | * | 10/2000 | Hansen ....................... 700/121 |
| 6,205,407 | B1 | * | 3/2001 | Testa et al. ................. 702/119 |
| 6,249,893 | B1 | * | 6/2001 | Rajsuman et al. .......... 714/738 |
| 6,353,904 | B1 | * | 3/2002 | Le ........................... 324/158.1 |
| 6,408,412 | B1 | * | 6/2002 | Rajsuman ................... 714/724 |

FOREIGN PATENT DOCUMENTS

| FR | 2658933 A | 8/1991 | ........... G06F/11/30 |

OTHER PUBLICATIONS

National Instruments Corporation, Austin, Texas, "Instrumentation Newsletter", vol. 11, No. 3, Third Quarter 1999.
R. Hutson: "Notes, Tutorial 8, Digital Test Applications," Oct. 18, 1998, IEEE Computer Society, Test Technology Technical Committee, Washington DC USA; XP002157245; figures 2–1.
Masciola J.A., et al: "A Software Architecture for Mixed Signal Funtional Testing" Proceedings of the International Test Conference, US, New York, IEEE, Oct. 2, 1994, pp. 580–586, XP000520019; ISBN: 0–7803–2103–0; abstract.
http://www.hp.com/pressrel/feb97/24feb97d.htm, HP Introduces Major Upgrade to HP VEE Visual Test Programming Language, Palo Alto, California, Feb. 24, 1997, 3 pages.

* cited by examiner

*Primary Examiner*—Phung M. Chung
*Assistant Examiner*—Anthony T. Whittington
(74) *Attorney, Agent, or Firm*—Lance Kreisman

(57) ABSTRACT

The invention is directed to techniques for providing a test procedure for testing a device using automatic test equipment (ATE). An ATE system includes memory having a test application stored therein, a test interface to connect to the device, and a processor coupled to the memory and the test interface. The processor is configured to operate in accordance with the test application to (i) provide a series of instructions based on a test procedure defining a device testing task, and (ii) control the test interface based on the provided series of instructions in order to test the device. The test procedure includes multiple test elements. Each test element defines instructions and programmable input variables that direct the processor to perform a particular test operation of the device testing task. The user of the ATE system combines test elements when creating the test procedure rather than write code from scratch, or modify code of prewritten templates. Accordingly, the user does not need to possess knowledge of a programming language or low-level ATE component details.

22 Claims, 9 Drawing Sheets

```
' - Set Drive Values
If (SetForceValue.ArgumentStr <> TL_C_EMPTYSTR) And _
   (SetIMagnitudeValue.ArgumentStr <> TL_C_EMPTYSTR) Then
With TheHdw.pins(PinList.ArgumentValue)
    If CStr(SetForceMode.ArgumentValue) = TL_C_CURRENT Then
        'force current
        If CStr(VClampLo.ArgumentValue) <> TL_C_EMPTYSTR Then
            Call .PinLevels.ModifyLevel(chVCL, CDbl(Val(VClampLo.ArgumentValue)))
        End If
        If CStr(VClampHi.ArgumentValue) <> TL_C_EMPTYSTR Then
            Call .PinLevels.ModifyLevel(chVCH, CDbl(Val(VClampHi.ArgumentValue)))
        End If
        If CStr(SetRelayControl.ArgumentValue) <> tl_GetIndexOf(TL_C_PPRCPFSTR) Then
            te_Irangeidx = tl_te_GetBestRange(SetForceValue.ArgumentValue, TheHdw.PPMU.ForceIRangeList, _
            'set the Ppmu in a current forcing mode, and voltage measure mode
            .PPMU.ForceCurrent(te_Irangeidx) = SetForceValue.ArgumentValue
        If (VClampLo.ArgumentStr <> TL_C_EMPTYSTR) Or (VClampHi.ArgumentStr <> TL_C_EMPTYSTR) Then
            'if clamps are used, then the PE relay is closed, and this then
            requires that the current loads be set to zero.
            Call .PinLevels.ModifyLevel(chISource, 0)
            Call .PinLevels.ModifyLevel(chISink, 0)
        End If
    End If
    If CStr(SetRelayControl.ArgumentValue) = tl_GetIndexOf(TL_C_PPRCPFSTR) Then
        te_Irangeidx = tl_te_GetBestRange(0, TheHdw.PPMU.ForceIRangeList, True)
        ' Override Functional Load levels on Pin Electronics
        ' set the PPMU itself to force 0A
        .PPMU.ForceCurrent(te_Irangeidx) = 0#
        ' Modify programmed load on Pin Electronics
        If CDbl(Val(SetForceValue.ArgumentValue)) > 0 Then
            ' set VT to ensure that load will be applied
            Call .PinLevels.ModifyLevel(chVT, TL_MAX_VT_LEVEL)
            ' set the load current
            Call .PinLevels.ModifyLevel(chISource, SetForceValue.ArgumentValue)
        Else
            ' set VT to ensure that load will be applied
```

FIG. 7

EASY TO PROGRAM AUTOMATIC TEST EQUIPMENT

FIELD OF THE INVENTION

The invention relates generally to automatic test equipment, and more particularly to techniques for controlling such equipment.

BACKGROUND OF THE INVENTION

In general, automatic test equipment (ATE) is equipment for testing devices (or complete systems) in an automated manner. Some ATE systems test electronic circuitry such as integrated circuits (ICs) or circuit boards. When a typical ATE system tests such a device (commonly referred to as the device under test or DUT), the ATE system applies stimuli (e.g., electrical signals) to the device and checks responses (e.g., currents and voltages) of the device. Typically, the end result of a test is either "pass" if the device successfully provides certain expected responses within pre-established tolerances, or "fail" if the device does not provide the expected responses within the pre-established tolerances. More sophisticated ATE systems are capable of evaluating a failed device to potentially determine one or more causes of the failure.

It is common for an ATE system to include a computer that directs the operation of the ATE system. Typically, the computer runs one or more specialized software programs to provide (i) a test development environment and (ii) a device testing environment. In the test development environment, a user typically creates a test program, i.e., a software-based construct of one or more files that controls various portions of the ATE system. In the device testing environment, the user typically provides the ATE system with one or more devices for testing, and directs the ATE system to test each device in accordance with the test program. The user can test additional devices by simply providing the additional devices to the ATE system, and directing the ATE system to test the additional devices in accordance with the test program. Accordingly, the ATE system enables the user to test many devices in a consistent and automated manner based on the test program.

In general, there are two conventional approaches to creating a test program using the test development environment of the ATE system: a code-based approach and a template-based approach. In the code-based approach, the user writes code in a programming language (e.g., the C or C++ programming languages) with extensions and libraries. In general, the code controls low-level operations of various components within the ATE system such as voltage and current sources, measuring devices, and data storage resources. Additionally, if multiple devices are to be tested in parallel, specific code must usually be added to control the additional ATE system components which are required to test the additional devices, substantially increasing program complexity. Accordingly, the code-based approach generally requires the user to posses extensive knowledge of a programming language and the various components of the ATE system. Typically, the developed code is several thousand lines long, and often requires significant time and effort to test and debug before formal device testing can begin.

The code-based approach is powerful and flexible because it allows the user to utilize the resources of the ATE system to their fullest potential. Since the user essentially develops the test program from scratch by writing the code, the user can customize and tailor the test program to take full advantage of the ATE system. For example, the user may include certain optimizations in the test program to operate the ATE system in a manner that provides the quickest test times attainable and thus maximize the capacity of the ATE system. Additionally, the user is not bound to industry testing methods or standards. Rather, the user has the capability to establish and implement user-specific testing methods and standards which, in some respects, may be superior to industry norms. Moreover, the user can test as many different types of devices as appropriate for the ATE system's capabilities. This is particularly important with regard to testing mixed-signal devices which utilize both analog and digital signals, and where device-specific configuration is typically required before devices are ready to accept stimulus signals and provide response signals.

In contrast to the code-based approach, the template-based approach is less burdensome on the user. In the template-based approach, the ATE system manufacturer supplies the user with a selection of test program templates. Each template typically includes code prewritten by the ATE manufacturer thus alleviating the need for the user to write code from scratch. Furthermore, such a template is generally customizable to a degree. For example, a particular test program template may allow the user to enter certain operating parameters that control particular actions performed by the ATE system when testing a device. It is also typical that a test program template can apply the customized operating parameters to multiple devices in parallel and make measurements from multiple devices in parallel. More extensive changes typically require the user to examine and edit the prewritten code if the ATE makes this underlying code accessible to the user. Accordingly, in the template-based approach, the task of the user is to select a template that is well-suited for the particular intended test, and to provide suitable operating parameters to the selected template in order to direct the ATE system to properly perform the intended test.

In general, from the perspective of the user, the template-based approach is relatively easier to use than the code-based approach. In the template-based approach, the user takes advantage of prewritten test programs thus avoiding having to write code from scratch. Accordingly, the user does not require extensive knowledge of a programming language or low-level details of the ATE system. Rather, the user simply selects a prewritten template and sets particular operating parameters for the selected template to customize the operation of the ATE system. As such, the user essentially plays the role of an ATE operator rather than a test program developer.

SUMMARY OF THE INVENTION

Unfortunately, the code-based and template-based approaches to creating a test program have certain drawbacks. In particular, the code-based approach, in which a user writes a test program from scratch, requires the user to posses extensive knowledge of a programming language and low-level details of the various components of the ATE system. Without such knowledge the user would not be able to create a test program that properly operates the various portions of the ATE system to test a device. Furthermore, even with such knowledge, the task of creating the test program is complex and error-prone. Typically, the user invests a significant amount of time developing and debugging a test program before the test program is ready for regular use in device testing.

The template-based approach, in which a user utilizes prewritten test program templates provided by the ATE manufacturer, suffers from certain drawbacks as well. First, this approach is relatively inflexible because the user can only choose from test program templates that the ATE manufacturer has conceived in advance. Such templates often cannot be customized to the extent necessary to test devices which have complex device-specific configuration requirements, such as mixed-signal devices.

Second, some ATE users prefer to establish and implement their own user-specific methods and standards rather than rely on those provided by the ATE manufacturer. In some situations, it is difficult or impossible for such users to implement their own methods and standards by modifying prewritten templates since these templates typically only accept operating parameter changes. More extensive modifications usually entail working at a lower level by searching and editing the underlying template instructions, and verifying that no undesired changes have been made. Modifying and debugging such code can, on occasion, be a more difficult task than writing code from scratch.

Third, as ATE manufacturers attempt to increase the flexibility and customizability of their templates, the templates tend to become more complex from the perspective of the user. In some situations, creating a test program by developing a proficiency in a prewritten template and then modifying that template may be a larger burden on the ATE user, than just writing a test program from scratch. In particular, the user may already possess some knowledge of a programming language and the components of the ATE system. Such a user would now have the burden of having to further learn the details of the manufacturer's test program template and then determine how to modify it.

To avoid making test program templates too complex, ATE manufacturers may attempt to provide a wider selection of test program templates. Unfortunately, this becomes extremely burdensome on the ATE manufacturer, and it is often impossible for the manufacturer to anticipate and satisfy every need of the ATE system user with a test program template. For example, it is unrealistic to expect an ATE manufacturer to provide a separate template for every possible mixed-signal test arrangement (a device test which involves both analog and digital signals) due to the large number of different signal combinations. The manufacturer would likely not be able to complete such an undertaking in a timely manner. Moreover, the ATE system user likely would be overwhelmed by the selection of test program templates, and perhaps may not choose the best-suited test program template for a particular situation. Nevertheless, if the ATE manufacturer does not provide a template which is well-suited for a desired device test (e.g., one that is capable of handling the correct number of analog and digital signals of the intended device under test), the ATE user likely will be unable to effectively test the devices unless the user modifies a less-suitable template. Often such modifications require extensive code changes.

In contrast to the above-described conventional code-based and template-based approaches to creating a test program, the invention is directed to techniques for providing a test procedure from multiple test elements. Each test element defines instructions and programmable input variables for a particular test operation. Preferably, each test element embodies the basic functionality of one of the ATE system's instruments or capabilities. The test procedure defines a device testing task and can operate as a test program, or be combined with other test procedures (or one or more instances of the same test procedure) to form a larger test program. Accordingly, the there is no need to write a test program code from scratch as in the conventional code-based approach. Furthermore, providing a test procedure from test elements generally provides greater flexibility than modifying prewritten test program templates since individual test operations defined by the test elements can be combined in a customized fashion to suit the particular needs of the ATE user.

In one arrangement, the ATE user combines multiple test elements from a test element database to form a test procedure which defines a device testing task. Each test element defines instructions and programmable input variables that direct a processor to perform a particular test operation of the device testing task. The ATE user sets at least a portion of the programmable input variables of each test element forming the test procedure to initial values. Additionally, the ATE user indicates an operating order for the test elements forming the test procedure. Furthermore, the ATE user stores the test procedure within a memory. Accordingly, the ATE user can create a customized test program suitable for testing a specific device such as an IC or a circuit board. Furthermore, the ATE user is not burdened with writing code from scratch and does not need to possess extensive knowledge of a programming language or low-level details of the ATE components as is necessary in the code-based approach.

Additionally, the ATE user has the capability to nest the test procedure within another test procedure. Such a nesting feature enables the ATE user to better organize the test program through modularization. Moreover, the ATE user may be able to reuse certain test procedures on other types of devices that are similar to the device for which the test procedure was originally created.

Preferably, the test element database includes analog signal test elements which define instructions that direct the processor to perform analog signal test operations, digital signal test elements which define instructions that direct the processor to perform digital signal test operations, and other test elements which define instructions for configuring the DUT to receive and transmit stimulus and response signals. The task of combining these analog signal test elements, digital signal test elements, and DUT configuration test elements to form a mixed-signal test procedure or test program is, in many respects, easier than trying to convert a mixed-signal template designed to handle a particular set of signals and DUT configuration requirements, as is sometimes necessary in the conventional template-based approach to effectively test a mixed-signal device.

After the ATE user creates a test procedure from test elements, an ATE system can use the test procedure to test a device. In particular, when the user begins a formal device test, the user enters commands on an input/output (I/O) device of the ATE system to begin a test. In response, a processor of the ATE system obtains the test procedure from memory, and provides a series of instructions based on the test procedure. In response, the processor controls a test interface, which connects (e.g., electrically or mechanically) with the device under test, based on the provided series of instructions in order to test the device.

Preferably, the ATE system provides a graphical user interface (GUI) through the I/O device. The user operates the GUI to create the test procedure from test elements of the test element database. In particular, the user preferably selects graphical icons corresponding to respective test elements, and arranges the icons in an editor window of the GUI to provide an operating order for the test elements. Additionally, the user sets programmable input variables of the test elements to initial values using dialog boxes which vary depending on the operation defined by the test element. The underlying instructions for the test operations which define the test elements is preferably prewritten by the ATE manufacture so that the user can simply manipulate icons and enter parameter values. Hence, the user has the power and flexibility of the code-based approach since the user creates a test program (or test procedure) from scratch, but is does not require extensive knowledge of a programming language or low-level details of ATE components since the user is not writing lines of code from scratch.

It should be understood that the test elements of the test procedure are preferably arranged so that information resulting from one test element of the test procedure can be used by another test element. That is, when the ATE system operates in accordance with the test procedure during a device test, the test operation results from one test element are used by the other test element. For example, one test element can direct the ATE to take measurements from a device under test. A subsequent test element can process these measurements to determine whether the device operates properly.

It should be further understood that the processor preferably includes multiple processing units that are associated with respective multiple devices. In this arrangement, controlling the test interface involves operating each of the multiple processing units based on the provided series of instructions to test each of the respective multiple devices in parallel. This arrangement enables the ATE system to be scaled by increasing the number of processing units within the processor. It should be farther understood that preferably a test procedure and its test elements automatically test as many devices in parallel as are presented to the test interface, in contrast to a conventional code-based test program which normally requires significant modification in order to test different numbers of devices in parallel.

Another arrangement of the invention is directed to a computer program product that includes a computer readable medium having instructions stored thereon for performing the above-described test procedure. The instructions, when processed by a data processing device, cause the data processing device to combine test elements from a test element database to form the test procedure in response to user commands such that the test procedure (i) defines a device testing task, and (ii) includes multiple test elements. The instructions further cause the data processing device to (i) set at least a portion of the programmable input variables of each test element forming the test procedure to initial values, (ii) indicate an operating order for the test elements forming the test procedure, and (iii) store the test procedure within a memory, in response to further user commands.

Another arrangement of the invention is directed to a computer program product that includes a computer readable medium having instructions stored thereon for testing a device. The instructions, when processed by a data processing device, cause the data processing device to obtain a test procedure which defines a device testing task. The test procedure includes multiple test elements defining instructions and programmable input variables that direct the processor to perform particular test operations of the device testing task. The instructions further cause the data processing device to provide a series of instructions based on the test procedure, and control the test interface based on the provided series of instructions in order to test the device.

The features of the invention, as described above, may be employed in an automatic test system and other related devices such as those manufactured by Teradyne, Inc. of Boston, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 7 shows, by way of example, yet another test program development window of the graphical user interface of FIG. 3.

DETAILED DESCRIPTION OF PREFERRED EMBODIMENTS

The invention is directed to techniques for providing a test procedure from multiple test elements for use in automatic test equipment (ATE). The test procedure defines a device testing task, and each test element defines instructions and programmable input variables for a particular test operation of the device testing task., Each test element preferably embodies the basic functionality of one of the ATE system's instruments or capabilities. The test procedure may be used as an ATE test program or combined with other test procedures (or instances of the same test procedure) to form a larger ATE test program. Accordingly, such techniques alleviate the need to create ATE test programs by writing code from scratch as in a conventional code-based approach, or by modifying templates as in a conventional template-based approach. Such techniques may be employed in ATE systems and other related devices such as those manufactured by Teradyne, Inc. of Boston, Mass.

Figure 1:
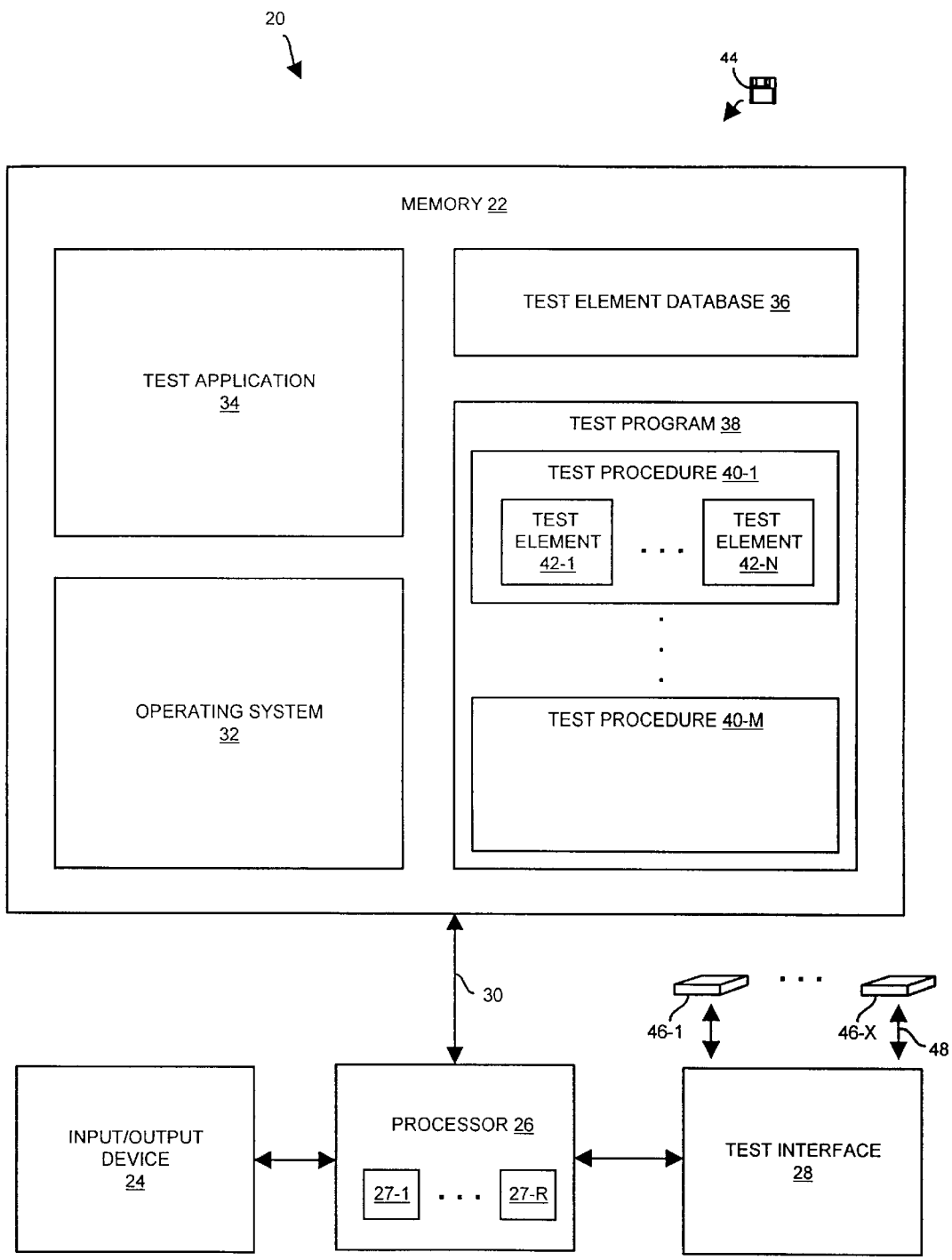
FIG. 1 shows a block diagram of an automatic test equipment system which is suitable for use by the invention.

FIG. 1 shows an ATE system 20 which is suitable for use by the invention. The ATE system 20 includes memory 22, an input/output (I/O) device 24, a processor 26 having multiple processing units 27, and a test interface 28. The arrows 30 of FIG. 1 represent information (i.e., signals) exchanged between the memory 22, the I/O device 24, the processor 26 and the test interface 28. Another ATE system which is suitable for use by the invention, and which is similar to the ATE system 20 of FIG. 1, is described in U.S. Pat. No. 5,910,895 (Proskauer et. al.), the teachings of which are hereby incorporated by reference in their entirety.

As shown in FIG. 1, the memory 22 stores various constructs including, among other things, an operating system 32, a test application 34, a test element database 36, and a test program 38. The test program 38 includes test procedures 40-1, . . . , 40-M (collectively, test procedures 40). Each of the test procedures 40 includes multiple test elements 42. For example, test procedure 40-1 includes test elements 42-1, . . . , 42-N.

One or more of the above-listed constructs in the memory 22 can be provided to the memory 22 through a computer program product 44 (e.g., one or more diskettes or tapes). Preferably, the test application 34 and the test element database 36 are provided by the manufacturer of the ATE system 20 to an ATE end-user via such a computer program product 44. Alternatively, these constructs can be provided to the memory 22 via other mechanisms (e.g., downloaded through a network interface, not shown) or created by an ATE user operating the ATE system 20.

The ATE system 20 operates in accordance with the operating system 32 and the test application 34 (i.e., one or more software programs coordinated by the operating system 32) to provide a user with a test development environment and a device testing environment. The test application 34 provides a graphical user interface (GUI) on the I/O device 24 enabling a user (i) to create the test program 38 (i.e., one or more test procedures 40) when operating within the test development environment, and (ii) to test devices 46-1, . . . , 46-X (collectively, devices 46) in accordance with the test program 38 when operating within the device testing environment.

As described above, each test procedure 40 includes multiple test elements 42. Preferably, each test element 42 is a modularized, prewritten grouping of instructions and variables provided by the manufacturer of the ATE system 20. Initially, these groupings are centrally stored in the test element database 36.

In one arrangement, when a user creates a test procedure 40 from multiple test elements 42, the user copies the actual groupings of instructions and variables for the multiple test elements 42 from the test element database 36 into a location of the memory 22 designated for storing the test procedure 40. In this arrangement, the test procedures 40 are essentially self-contained in that each test procedure 40 includes all of the instructions and variables necessary for directing the ATE system 20 to perform a particular device testing task.

In another arrangement, when the user creates a test procedure 40 from multiple test elements, the user adds test element references and variable values (represented as test elements 42 shown in FIG. 1) to the test procedure 40. The test element references are essentially pointers to the test element instructions and variables which remain centrally stored in the test element database 36. In this arrangement, at device testing time, the ATE system 20 retrieves the instructions and variables for the test elements 42 based on the test element references, and uses the earlier-provided variable values as initial values for the variables. This arrangement uses less memory space than the earlier-described self-contained arrangement. Furthermore, when revisions and improvements are made to a particular test element 42, i.e., when a change is made to the instructions of variables of the particular test element 42, each test procedure 40 referencing that test 42 is automatically capable of accessing the change.

It should be understood that, in either the self-contained arrangement or the test element reference arrangement, the test procedures 40 are considered to include the test elements 42 since the groupings of instructions and variables for each test element 42 is retrieved from the test element database 36 at some point in both arrangements. In the self-contained arrangement, the groupings are retrieved at test procedure creation time. In the test element reference arrangement, the groupings are retrieved at device testing time.

It should be further understood that the invention overcomes drawbacks of the conventional code-based and template-based approaches to creating a test program. In particular, the user of the code-based approach needs to write code from scratch to create a test program. Such code writing is unnecessary with the invention. Rather, the user of the invention combines test elements (i.e., prewritten groupings of instructions and variables) to create a test program 38. The test program 38 can be just as powerful and flexible as one created using the code-based approach since the user of the invention can select test elements 42 best-suited for performing particular test operations to form a custom-tailored test procedure 40 for performing a particular device testing task. Furthermore, multiple test procedures 40 can be combined to perform multiple device testing tasks for a device test.

Furthermore, it should be understood that the user of the template-based approach often needs to edit underlying prewritten code to customize a template for an effective device test. Such an undertaking is often difficult if the user is not knowledgeable in the programming language of the template. Such a modification is unnecessary with the invention. Rather, the user of the invention can combine suitable test elements 42 (preferably, by arranging graphical icons on a GUI, as will be explained shortly) and providing variable values to create a test program 38. Each of these test elements 42 can test different numbers of devices in parallel without modification. Accordingly, the user does not need to wrestle with any underlying code.

Figure 2:
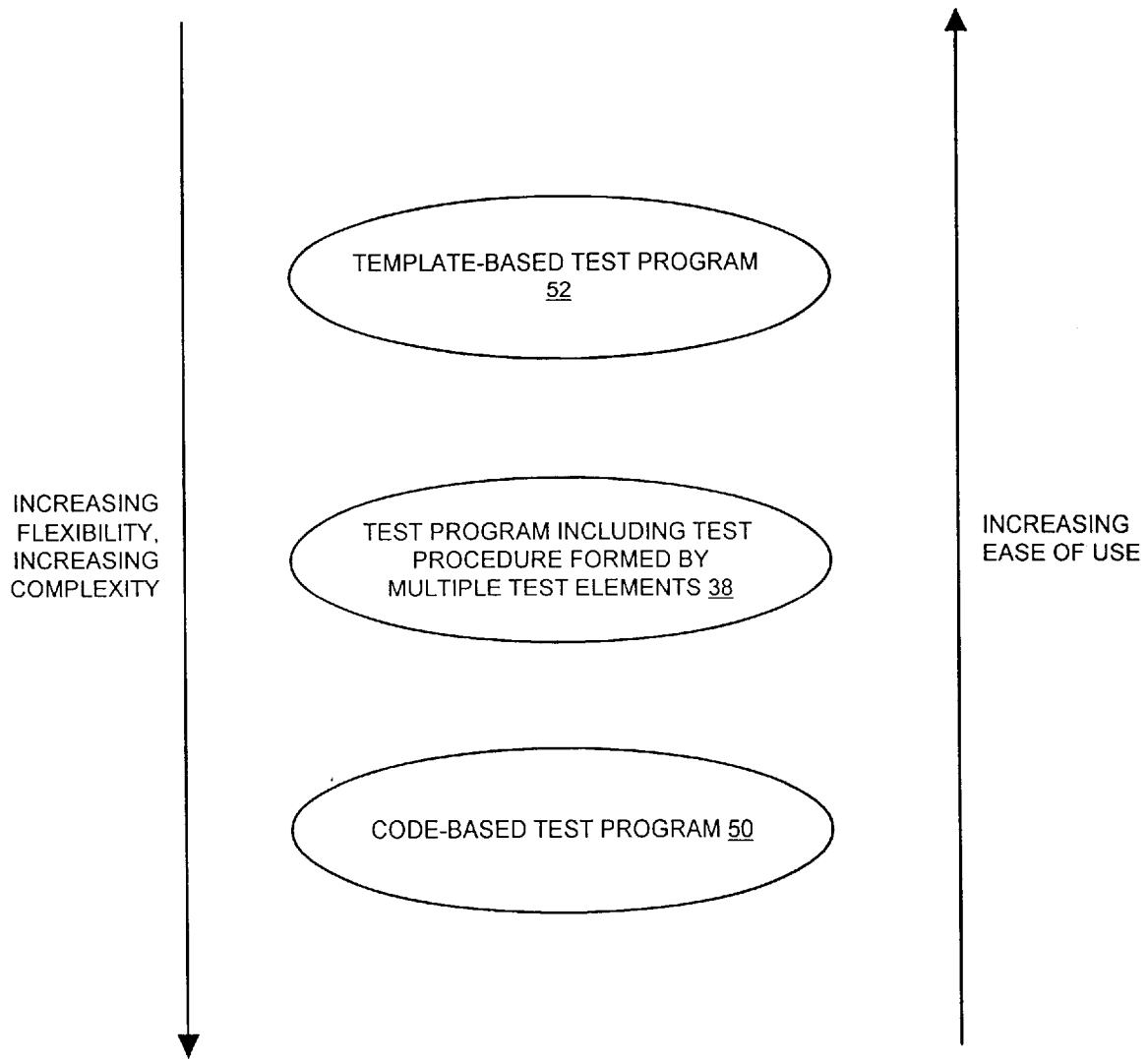
FIG. 2 shows a diagram illustrating how test programs of the invention and conventional approaches compare with respect to flexibility, complexity and ease of use from a perspective of a user.

FIG. 2 illustrates a general comparison, from the perspective of a user, of the test program 38 of the invention, a typical test program 50 created using the conventional code-based approach, and a typical test program 52 created using the conventional template-based approach. As shown in FIG. 2, the test program 38 of the invention is generally more flexible than the template-based test program 54. In particular, with the ATE system 20 of the invention, the user can test as many different types of devices as appropriate for the ATE system's capabilities. The user is not limited by the prewritten temple choices provided by the ATE manufacturer as in the template-based approach.

Furthermore, a user creating the test program 38 of the invention can simply combine test elements 42 from the test element database 36. No code modifications are necessary to create the test program 38. In contrast, in the template-based approach, code modifications are often required for an effective device test if no well-suited templates are provided by the ATE manufacturer. Unfortunately, extensive code modifications are generally difficult and require significant testing and debugging before regular testing can begin since the user has to locate and rewrite portions of the template without corrupting the operation of other related or adjacent template portions.

Additionally, as shown in FIG. 2, from the perspective of the user, the test program 38 of the invention is generally less complicated to create than the code-based test program 50. To create the test program 38 of the invention, the user works at a level above actual code, and combines test elements 42 (prewritten groupings of instructions and variables) and provides initial values to form a test procedure 40 or multiple test procedures 40 for the test program 38. Knowledge of a programming language and the low-level details of the ATE components are not required to create the test program 38. On the other hand, in the code-based approach, the user must possess knowledge of a programming language and low-level details of the various components of the ATE system. Additionally, once a user creates the test program 50 using the code-based approach, the user generally must spend considerable time and effort testing and debugging code statements within the test program 50.

Furthermore, it is likely that the code-based test program 50 is not as well organized as the test program 38 of the invention since any organizational controls over a user-written test program result from self-imposed controls. That is, there is no guarantee that the code-based test program 50 will be modularized, well-organized or easy to debug. On the other hand, the test program 38 of the invention naturally takes a modular structure due to the arrangements of test elements 42 forming test procedures 40, and one or more test procedures 40 forming a test program 38. Moreover, if the test program 38 uses references to test elements 42 within the test element database 36 and if a revision or improvement is made to a particular test element 42, the ATE system 20 propagates that change to the test program 38 of the invention and every other test program 38 and test procedure 40 using that test element 42. Hence, in general, the test program 38 of the invention is less complex from the user's perspective than the code-based test program 50.

Referring again to FIG. 2, from the perspective of the user, the test program 38 of the invention is generally easier to use than the code-based test program 50. The test program 38 of the invention utilizes a standardized interface (e.g., a GUI) regardless of the particular device test. Moreover, in one arrangement, the test program 38 is controlled and launched from a common standard spreadsheet program. One spreadsheet program that is suitable for such use is Microsoft Excel, which is manufactured by Microsoft Corporation of Redmond, Wash. Accordingly, an operator of the ATE system 20 does not need to learn a new interface for every different device test.

On the other hand, the code-based test program 50 typically uses a unique user interface since the code-based test program 50 is handwritten exclusively for testing a particular device. Accordingly, an ATE test operator must learn a new interface for each new code-based test program 50. Hence, the code-based test program 50 is generally less easy to use than the test program 38 of the invention.

Figure 3:
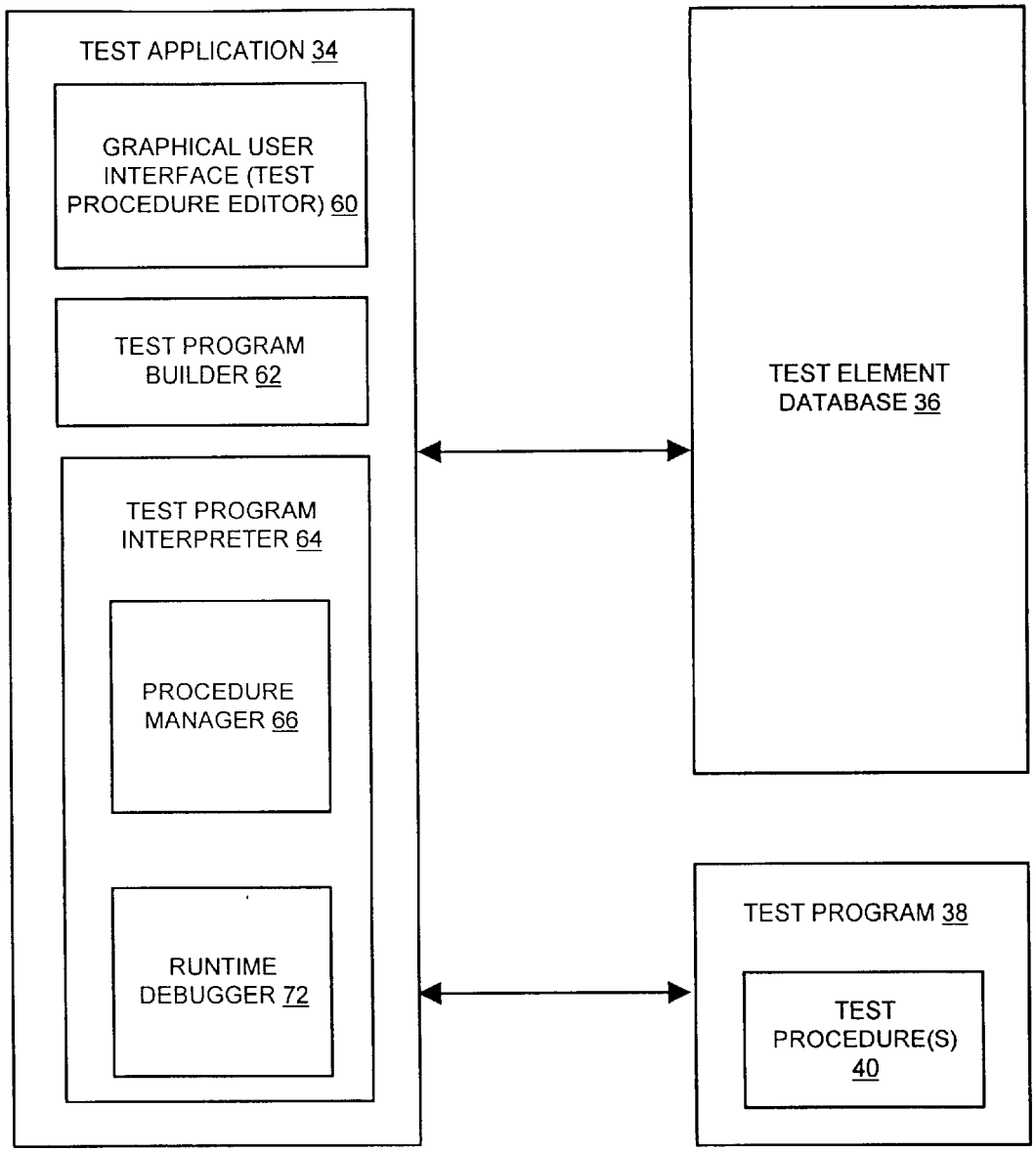
FIG. 3 shows a detailed block diagram of a test application of FIG. 1 and its interaction with various components when operating within the automatic test system.

Further details of the invention will now be provided with reference to FIG. 3. The test application 34 has a number of components including, among others, a graphical user interface (GUI) 60, a test program builder 62 and a test program interpreter 64. The test program interpreter 64 includes, among other things, a program manager 66 and a runtime debugger 72.

Although the following description of the test application components may describe the components as performing particular operations for simplicity, it should be understood that the processor 26 actually performs these operations under direction of the components. That is, each test application component directs the processor 26, perhaps in conjunction with one or more other portions of the ATE system 20, to perform such operations.

The GUI 60 operates (through the I/O device 24) as a front-end for the test application 34. That is, the GUI 60 prompts the user of the ATE 20 for commands and data, and provides the commands and data to the test program builder 62 and the test program interpreter 64. Additionally, the GUI 60 receives responses to the user commands and data from the test program builder 62 and the test program interpreter 64, and displays the responses as feedback to the user on the I/O device 24.

The test program builder 62 is responsible for building the test program 38 in the test development environment. As shown in FIG. 3, the test program builder 62 accesses the test element database 36 to build the test program 38. In particular, commands provided by the user through the GUI 60 direct the test program builder 62 to combine and arrange test elements to create one or more test procedures 40. An instance of each test procedure 40 can operate as a test program 38 itself, or combine with other test procedures 40 or instances of the same test procedure 40 to form a larger test program 38.

The test program interpreter 64 is responsible for device testing based on the test program 38 in the device testing environment. In particular, the program manager 66 interprets test element instructions of the test elements forming the test procedures 40 of the test program 38, and performs the low-level operations needed to perform the device test. In particular, the test program interpreter 64 transforms the test element parameters into small sequences of test actions and coordinates operation of the processing units 27. The user can remain ignorant of these low-level details. Further details of the operation of the various test application components will be provided shortly.

Figure 4:
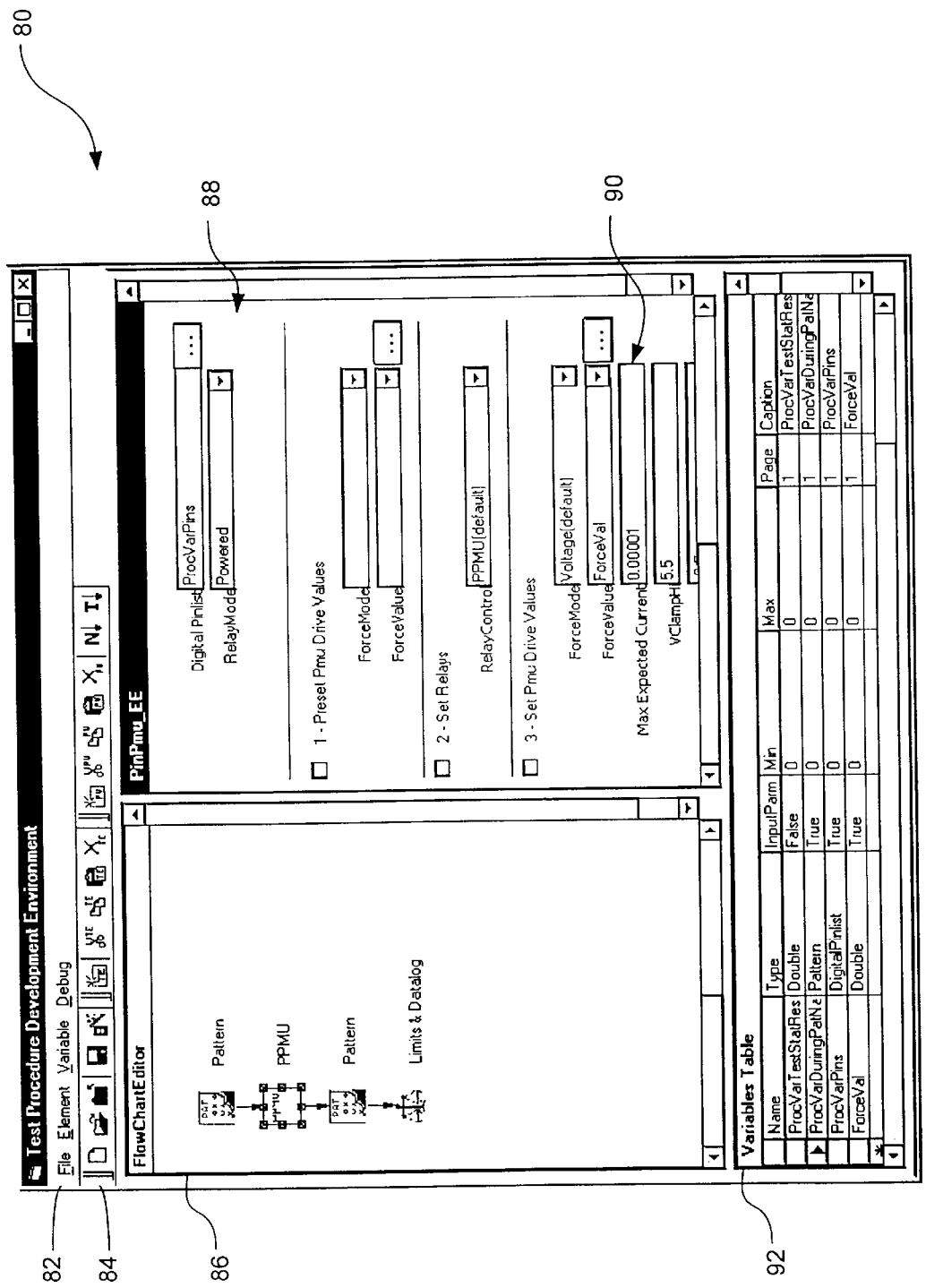
FIG. 4 shows, by way of example, a test program development window of a graphical user interface of FIG. 3.

FIG. 4 shows, by way of example, a window 80 of the test development environment that is suitable for use by the ATE system 20. The window 80 includes menu 82 and toolbar 84 which operate in a conventional manner to enable a user to enter commands to perform particular tasks (e.g., to create or store a test procedure).

The window 80 further has a number of subwindows. In particular, the window 80 includes a test procedure editor subwindow 86 that graphically displays (e.g., in a top-down iconic format) an arrangement order for multiple test elements 42 of the current test procedure 40. In the example, the current test procedure 40 begins with a "Pattern" test element as shown by the "Pattern" icon, which is followed by a "PPMU" test element as shown the "PPMU" icon, and so on. The test element order can be modified by adding, inserting, or deleting test element icons. Furthermore, the test element order can be modified by changing arrows connecting the test element icons to provide loops or branches in the flow. Accordingly, the user can construct complex, conditional procedure flows to accomplish complex testing tasks.

The window 80 further includes an input value subwindow 88 which prompts the user to input values and/or variable names required by a particular test element 42. As shown in FIG. 4, by way of example, the "PPMU" test element is selected in the test procedure editor subwindow 86 as shown by the boxed outline around the "PPMU" icon, and the subwindow 88 prompts the user to enter required values for "PPMU" test element. By way of example only, the user has entered (e.g., via a keyboard or mouse) a value of "0.00001" in a field 90 which corresponds to a "Max Expected Current" variable of the "PPMU" test element.

The window 80 further includes a variable table subwindow 92 which provides the user with an overview of the variables used by the test procedure 40, and their properties. The user can change particular property values used by the test procedure 40 by simply selecting a field of the variable table subwindow 92 (e.g., using a mouse of the I/O device 22), and entering a new property value in that field.

Figure 5:
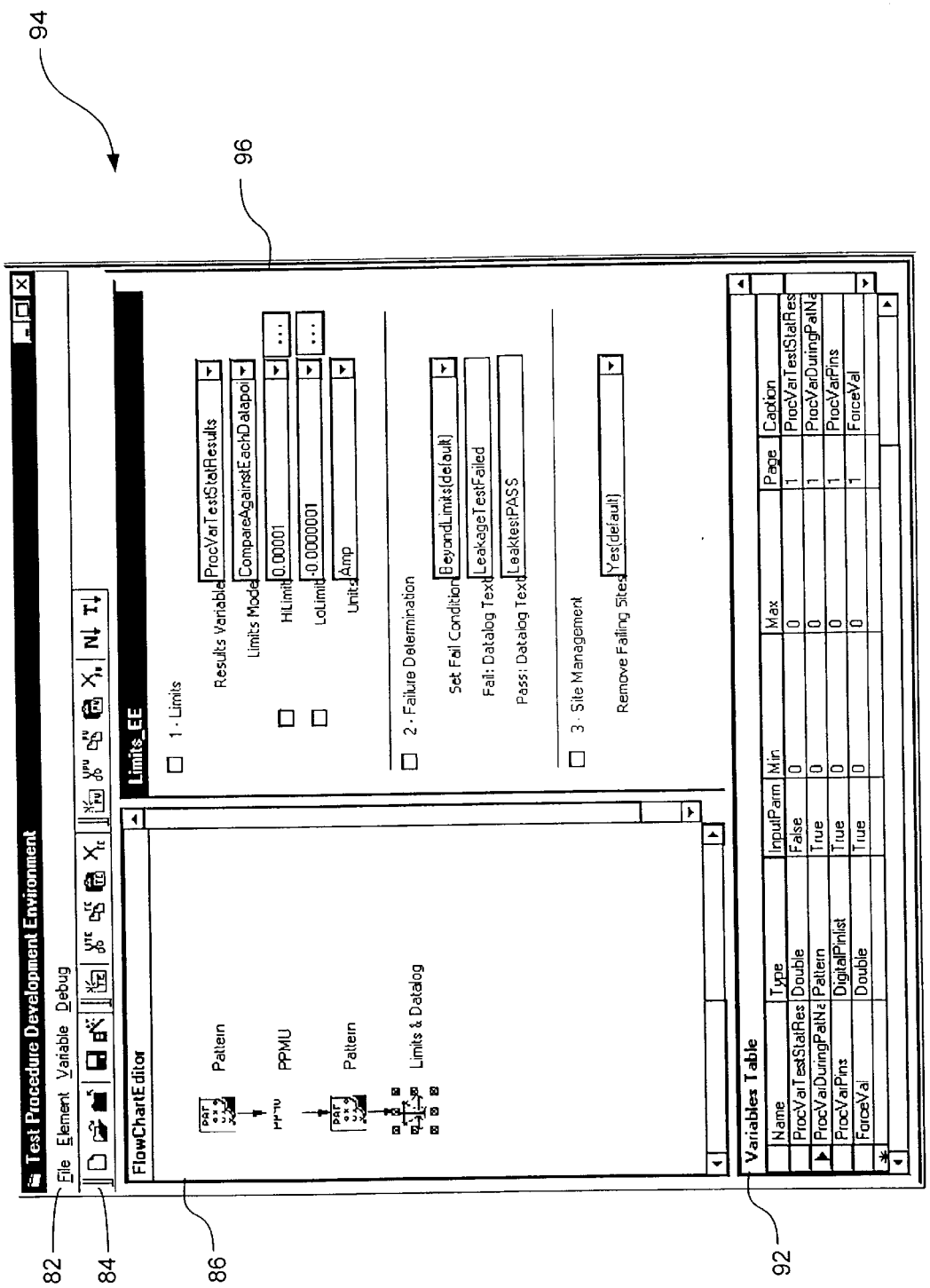
FIG. 5 shows, by way of example, another test program development window of the graphical user interface of FIG. 3.

FIG. 5 shows, by way of example only, how the window 80 of the test development environment can change based on input from the user. In particular, suppose that the user selects another test element of the flow within the test procedure editor subwindow 86 of the window 80 (also see FIG. 4). In response, the user will see window 94 on the I/O device 22, as shown in FIG. 5. Window 94 is similar to window 80, except that window 94 includes a modified test procedure editor subwindow 86' which shows the icon of the newly selected test element highlighted or boxed (i.e., the "Limits & Datalog" icon), rather than the earlier selected icon. Furthermore, the subwindow 88 of window 80 is replaced with a new subwindow 96 corresponding to the newly selected test element.

The above-described window-based presentation arrangement makes the use of test elements superior to general purpose programming tools. For example, the test element specific windows 88 and 96 indicate to the user what information is needed. Accordingly, the user does not need to consult reference material or posses extensive experience with the ATE system 20.

Figure 6:
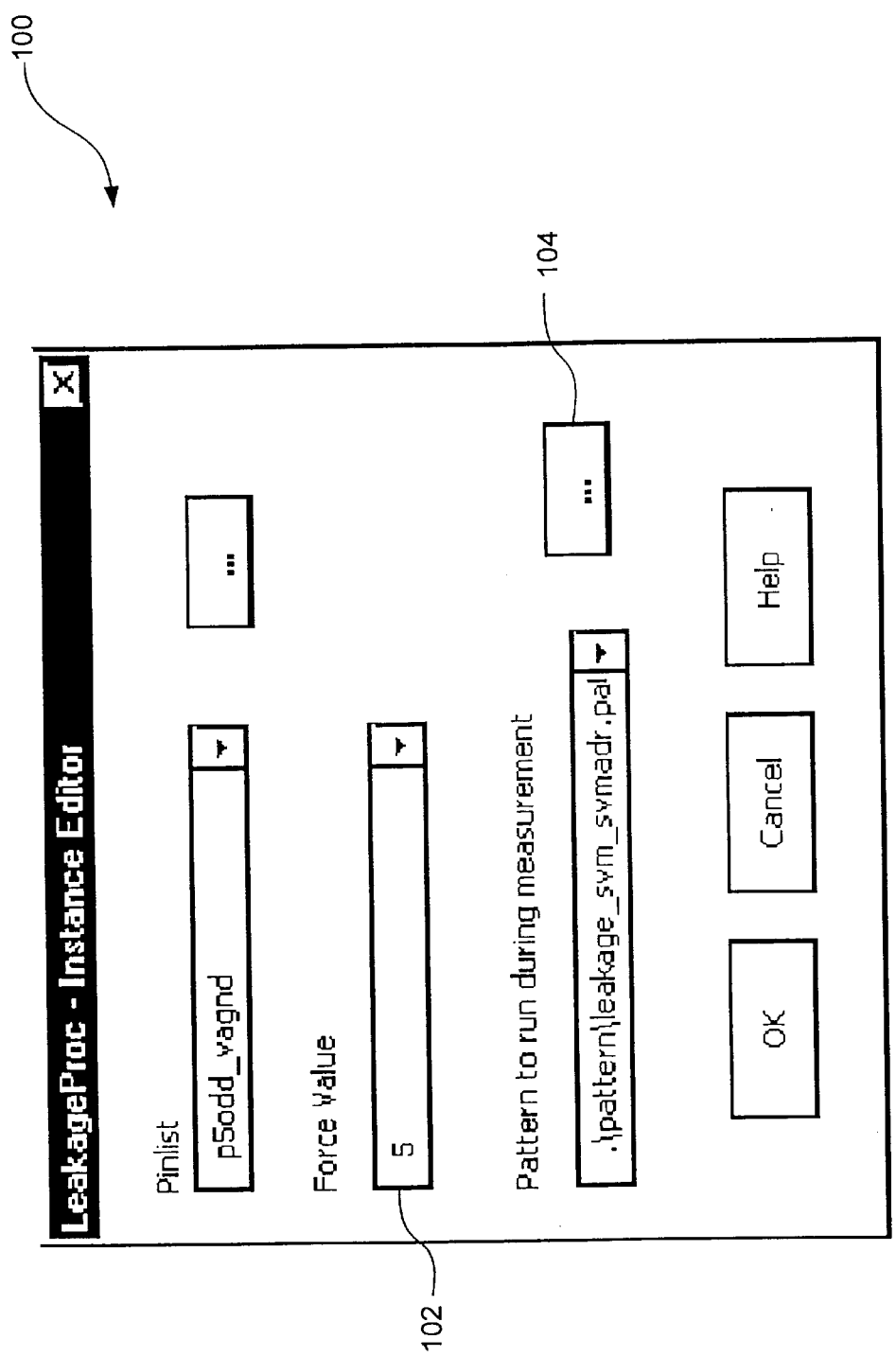
FIG. 6 shows, by way of example, yet another test program development window of the graphical user interface of FIG. 3.

When the user is finished adding test elements 42 to the test procedure 40, the user may wish to set certain variables to initial values. For example, the user may wish to perform one test an a device using a voltage supply of 3.5 volts, and then repeat the test on the same device using a voltage supply of 5.0 volts. To accommodate the user, the ATE system 20 allows the user to create multiple instances of the test procedure 40 (one for each test). To this end, the user enters commands into the GUI 60, and the ATE system 20 prompts the user to create multiple instances of the test procedure 40, distinguishing each instance by a unique identifier (e.g., an instance name or number). FIG. 6 shows, by way of example only, an instance editor window 100 which prompts the user to enter values for a particular instance of the test procedure 40. Accordingly, the user can develop the test program 38 so that it performs variations of the same test on the same device using multiple instances of the same test procedure 40.

It should be understood that the ATE system 20 of the invention is easy to use when creating the test procedure 40 since the user simply retrieves test elements (i.e., test element icons representing the desired test elements) from the test element database 36, and arranges them and initializes their input variables. The user does not need to write or modify any code as in conventional approaches to creating a test program. Nevertheless, the ATE system 20 has the capability to show the instructions and variables defined by a test element 42 if the user wishes to see them. For example, the user can direct the ATE system 20 to display the instructions and variables using the menu 82 or toolbar 84. As shown in FIG. 7, the ATE system 20 responds by showing the user a window 106 having the instructions and variables 108 defined by a selected test element 42.

Figure 8:
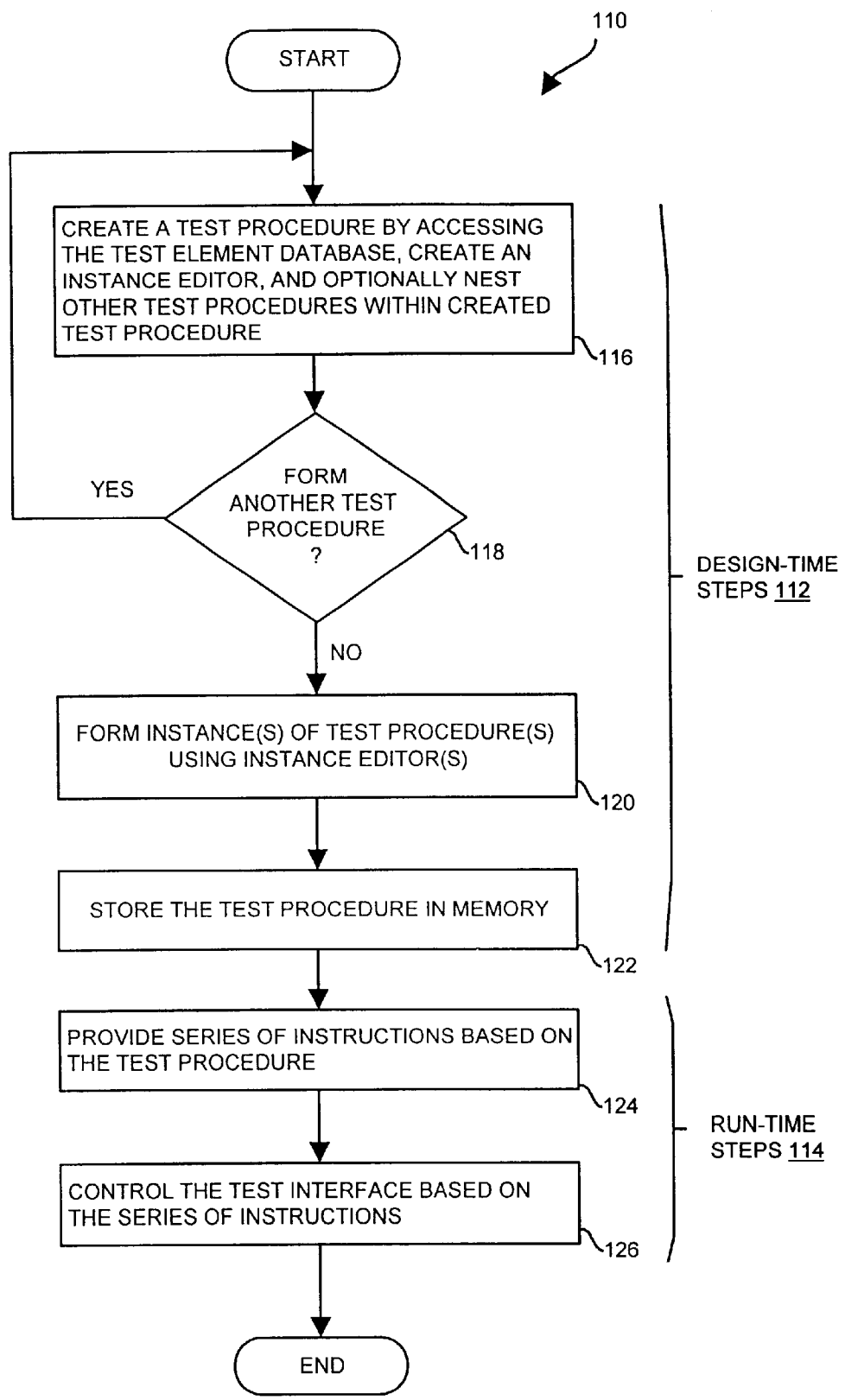
FIG. 8 shows a flow diagram of a procedure performed by the automatic test system of FIG. 1 when operating in accordance with the invention.
Figure 9:
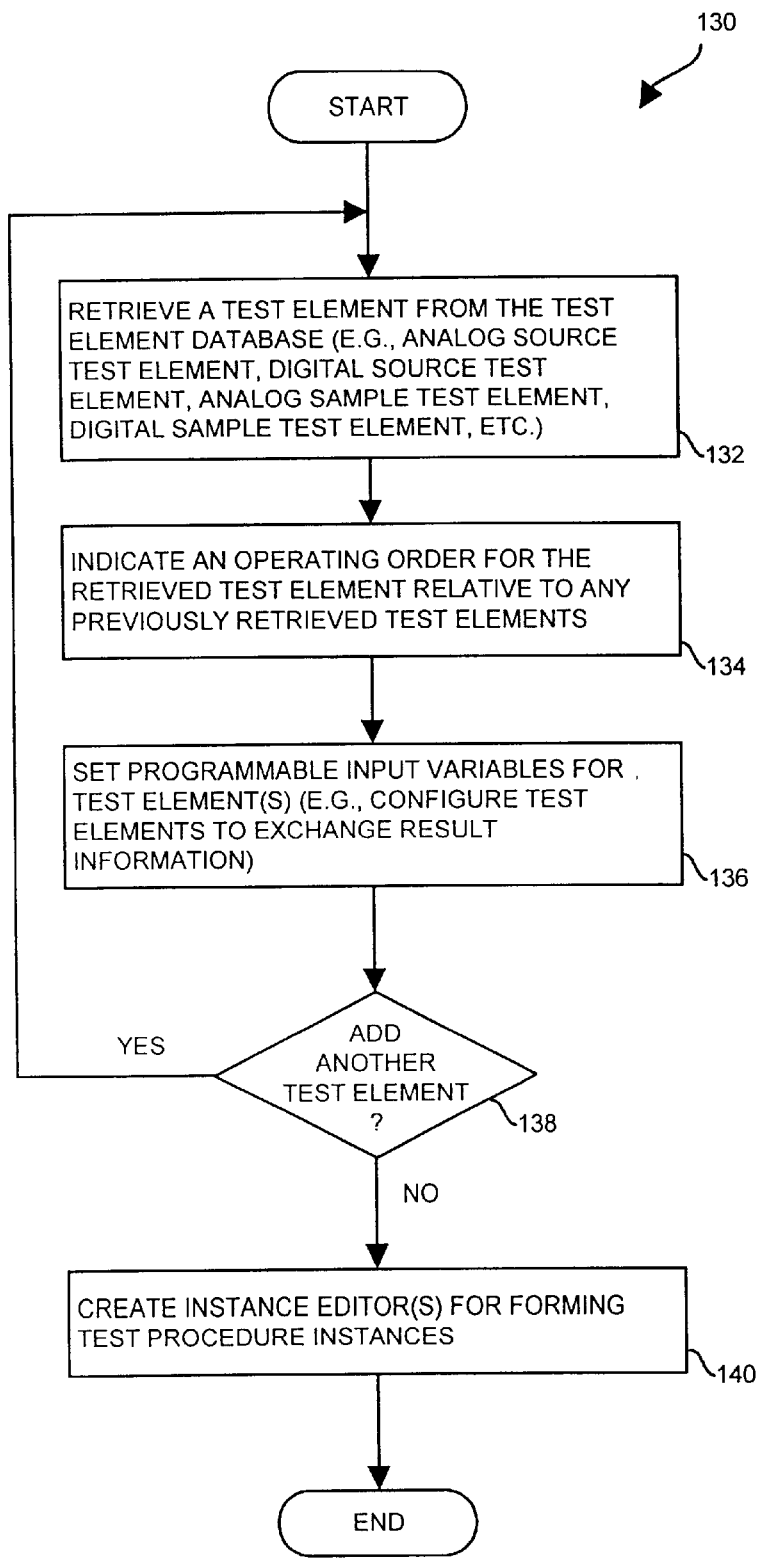
FIG. 9 shows a flow diagram of a procedure performed by a user of the automatic test equipment system of FIG. 1.

Further details of the operation of the ATE system 20 will now be provided with reference to FIGS. 8 and 9. FIG. 8 shows a flow diagram of a procedure 110 performed by the ATE system 20. The procedure includes design-time steps 112 which are performed when the ATE system 20 operates in the test development environment, and run-time steps 114 which are performed when the ATE system operates in the device testing environment.

In step 116, the ATE system 20 accesses the test element database 36 to create a test procedure 40. In particular, as shown in FIGS. 4 through 6, the GUI 60 and the test procedure builder 62 enables the user to combine test elements 42 from the test element database 36, set values for their variables, and order the test elements relative to each other to create the test procedure 40. Optionally, the user may include one or more previously created test procedures 40 in the test procedure 40 presently being created.

In step 118, the ATE system 20 (i.e., the GUI 60 and test procedure builder 62) provides the user with the choice of creating additional test procedures. If the user directs the ATE system 20 to create another test procedure 40, step 118 proceeds back to step 116. Otherwise, step 118 proceeds to step 120.

In step 120, the ATE system 20 forms an instance of the earlier-created test procedure 40. The user provides input into the instance editor window 100 (see FIG. 6) to set initial values for use during device testing.

In step 122, the ATE system 20 stores, in the memory 22, the test procedure instance 40. Hereinafter, the test procedure instance 40 will be referred to as the test procedure 40 for simplicity. It should be understood that the ATE system 20 can handle multiple instances of the test procedure 40. Step 122 then proceeds to step 124 (the beginning of the device testing environment).

In step 124, the ATE system 20 provides a series of instructions based on the test procedure 40. In one arrangement where the test procedure 40 includes references to test element instructions stored within the test element database 36, the program manager 66 of the test procedure interpreter 64 retrieves the instructions from the test element database 36. In another arrangement where the test procedure 40 includes actual instructions and variables for each test element 42 forming the test procedure 40, the program manager 66 obtains the instructions by simply reading portions of the test procedure 40 from the memory 22. In both arrangements, the program manager 66 transforms the series of instruction into a sequence of operations which are performed by each of the processing units 27 of the processor 26.

In step 126, each processing unit 27 of the processor controls the test interface 28 to test a respective device 46. For example, the processing units 27 may apply or measure signals 48 of the devices 46. The simultaneous operation of the processing units 27 enables the ATE system 20 to test multiple devices in parallel automatically.

Further details of the activities of the user, when creating the test procedure 40, will now be provided with reference to FIG. 9. When the user operates the ATE system 20 to create the test procedure 40, the user performs a procedure 130 using the GUI 60 and the test program builder 62 of the test application 34.

In step 132, the user retrieves a test element from the test element database 36. For example, for a mixed-signal device, the user may select one of an analog source test element, a digital source test element, an analog sample test element, a digital sample test element, etc.

In step 134, the user provides information about the order of operation of the retrieved test element relative to any other test elements that have been added to the test procedure 40. Preferably, the user arranges test element icons within a test procedure editor window of the GUI 60 (e.g., see subwindow 6 of FIG. 4). For example, the user may order the most recently retrieved test element after a previously retrieved test element.

In step 136, the user sets programmable input variables for any of the test elements 42 of the test procedure 40. For example, the user may enter variable names for the most recently retrieved test element 42 using a subwindow of the GUI 60 (e.g., see subwindow 88 of FIG. 4). Furthermore, the user may configure a previously retrieved test element 42 to provide results into the most recently retrieved test element 42, for example by using the procedure variables defined in the variable table subwindow 92. This configures the test elements 42 to pass information among themselves automatically. Preferably, this is done with procedure variables which hold multiple values, one for each DUT to be tested in parallel.

In step 138, the user determines whether to add another test element 42 to the test procedure 40. If the user wishes to add another test element 42, the user repeats steps 132 through 136. Otherwise, the user proceeds to step 140.

In step 140, the user creates an instance editor for each test procedure 40. In particular, in response to user input through the GUI 60, the test program builder 62 analyzes the test procedure 40 to determine which programmable input variables of the test elements 42 require initial values prior to device testing. In one arrangement, the test program builder 62 examines information used within the variable table subwindow 92 (see FIGS. 4 and 5) to identify the programmable input variables that require initial values. The ATE system 20 then creates the instance editor window 100 to prompt the user to provide the required initial values (see FIG. 6). The user can then create one or more instances of the test procedure 40 for device testing (see step 120 in FIG. 8). Since the instance editor prompts the user to provide the initial values needed by the test procedure 40 for device testing, the user does not need to look up such requirements in manuals or rely on prior experience using the test procedure 40.

It should be understood from the above-provided description that the techniques of the invention enable a user to create a test procedure 40 for use as a test program 38 itself, or for use with other test procedures 40 (or multiple instances of the same test procedure) to form a larger test program 38 without drawbacks of conventional approaches to creating a test program. In particular, the user combines test elements which define groupings of instructions and variables into an ordered arrangement which directs the ATE system 20 to perform a device test on one or more devices 46. The ATE system 20 is easy to use, does not require expert knowledge of the low-level ATE instruments and components or a programming language, and is flexible so that the user can direct how he or she wants to use the ATE system's resources. The features of the invention may be particularly useful in computerized devices manufactured by Teradyne, Inc. of Boston, Mass.

EQUIVALENTS

While this invention has been particularly shown and described with references to preferred embodiments thereof, it will be understood by those skilled in the art that various changes in form and details may be made therein without departing from the spirit and scope of the invention as defined by the appended claims.

For example, the I/O device 22, the memory 22 and the processor 24 may form portions of a general purpose computer (e.g., mainframe, workstation, distributed computing system, etc.), or form a specialized ATE device. The memory 22 may include both primary memory (e.g., semiconductor memory), secondary memory (e.g., disk or tape memory), other storage media (e.g., CDROM, network servers, etc.), or a combination different memory types. Additionally, the I/O device 24 may include multiple input and output devices such as one or more displays, keyboards, printers, mice, etc.

Furthermore, although the processor 26 is shown to include multiple processing units 27, the processor 26 may be implemented as a single processor that multiplexes time to test each device 46 connected to the test interface 28 at any given time. Alternatively, the processor 26 may have a multiprocessor configuration or a distributed processing configuration which controls the multiple processing units 27 respectively associated with the multiple devices 46. Various interconnection mechanisms (e.g., a computer bus, backplane, etc.) are suitable for handling the information exchange 30 between the various components of the ATE system 20.

In the context of testing ICs or circuit boards, the test interface 28 may include probes or pins for making electrical contact with the devices 46. In other contexts, the test interface 28 may include a variety of devices specific to those contexts. For example, to mechanically test a device, the test interface may include force application and measuring devices.

Additionally, it should be understood that the ATE system 20 does not necessarily require each test procedure 40 to include multiple test elements 42. Rather, a test procedure 40 can include a single test element 42. However, the test procedures 40 preferably include multiple test elements 42 due to their naturally provided organizational benefits (i.e., modularizing instructions and variables into groupings which perform a particular test operation).

Furthermore, it should be understood that the user can disable one or more of the processing units 27 of the processor when the ATE system 20 operates at less than full capacity. For example, if the user wishes to test a single device 46, the user can configure the ATE system 20 to operate only one processing unit 27 to test that device 46.

What is claimed is:

1. A system for testing a device, comprising:
   memory having a test application stored therein;
   a test interface to connect to a device; and
   a processor coupled to the memory and the test interface, the processor being configured to operate in accordance with the test application to:
   i) provide a series of instructions based on a test procedure defining a device testing task, the test procedure including multiple test elements, each test element defining instructions and programmable input variables that direct the processor to perform a particular test operation of the device testing task, and
   ii) control the test interface based on the provided series of instructions in order to test the device,
   wherein each test element defines instructions for only a partial device testing task such that the multiple test elements together form a complete device testing task for testing the device.

2. The system of claim 1, further comprising:
   an input/output device coupled to the processor, wherein the processor is further configured to operate in accordance with the test application to provide a graphical user interface on the input/output device through which a user directs the processor to:
   (i) combine test elements from a test element database to form the test procedure;
   (ii) set at least a portion of the programmable input variables of each test element forming the test procedure to initial values;

(iii) indicate an operating order for the test elements forming the test procedure; and (iv) store the test procedure within the memory.

3. A system for testing a device, comprising:

memory having a test application stored therein;

a test interface to connect to a device; and a processor coupled to the memory and the test interface, the processor being configured to operate in accordance with the test application to:

i) provide a series of instructions based on a test procedure defining a device testing task, the test procedure including multiple test elements, each test element defining instructions and programmable input variables that direct the processor to perform a particular test operation of the device testing task, and ii) control the test interface based on the provided series of instructions in order to test the device, wherein the test procedure includes:

a first test element which defines instructions directing the processor to perform a first test operation that provides a first result; and a second test element which defines a second set of instructions directing the processor to perform a second test operation that provides a second result which is based on the first result.

4. The system of claim 1 wherein the test procedure is a nested test procedure that is nested within another test procedure such that the processor provides instructions to perform the device testing task when providing instructions based on the other test procedure.

5. The system of claim 1 wherein the processor includes multiple processing units that are associated with respective multiple devices, and wherein each of the multiple processing units is configured to control a respective portion of the test interface based on the provided series of instructions to test the respective multiple devices in parallel.

6. The system of claim 1 wherein the processor includes multiple processing units that are associated with respective multiple devices, and wherein the multiple processing units are configured to control respective portions of the test interface based on instructions defined by a single instance of the test procedure to test the respective multiple devices in parallel.

7. The system of claim 1 wherein the device is a mixed signal device, and wherein the test procedure includes:

a first test element which defines instructions directing the processor to perform an analog signal test operation; and a second test element which defines instructions directing the processor to perform a digital signal test operation.

8. The system of claim 1 wherein the processor is further configured to:

analyze the test procedure to identify which programmable input variables of the test elements of the test procedure require initial values; and create a graphical user interface component which prompts a user to provide the required initial values to initialize the identified programmable input variables.

9. A method for testing a device, comprising the steps of:

obtaining a test procedure which defines a device testing task, the test procedure including multiple test elements, each test element defining instructions and programmable input variables that direct a processor to perform a particular test operation of the device testing task;

providing a series of instructions based on the test procedure; and controlling a test interface based on the provided series of instructions in order to test the device, wherein the step of controlling the test interface includes the steps of:

based on a first test element, performing a first test operation that generates a first test result, and based on a second test element, performing a second test operation that (i) obtains the first test result generated by the first test operation performed by the processor under direction of the first test element, and (ii) generates a second test result based on the first test result.

10. The method of claim 9, further comprising the steps of:

providing a graphical user interface on an input/output device through which a user directs the processor to:

(i) combine test elements from a test element database to form the test procedure;

(ii) set at least a portion of the programmable input variables of each test element forming the test procedure to initial values;

(iii) indicate an operating order for the test elements forming the test procedure; and (iv) store the test procedure within a memory.

11. The method of claim 9 wherein the step of providing includes the steps of:

providing instructions directing the processor to perform the first test operation that generates the first test result based on the first test element of the test procedure; and providing instructions directing the processor to perform the second test operation that generates the second test result based on the second test element of the test procedure, the second test result being based on the first test result.

12. The method of claim 9 wherein the test procedure is a nested test procedure that is nested within another test procedure, and wherein the step of providing includes the step of:

providing instructions directing the processor to perform the device testing task when providing instructions based on the other test procedure.

13. The method of claim 9 wherein the test interface includes multiple processing units that are associated with respective multiple devices, and wherein the step of controlling the test interface includes the steps of:

operating each of the multiple processing units of the test interface based on the provided series of instructions to test each of the respective multiple devices in parallel.

14. The method of claim 9 wherein the test interface includes multiple processing units that are associated with respective multiple devices, and wherein the step of controlling the test interface includes the steps of:

operating the multiple processing units of the test interface based on instructions defined by a single instance of the test procedure to test each of the respective multiple devices in parallel.

15. The method of claim 9 wherein the device is a mixed signal device, and wherein the step of providing includes the steps of:

providing instructions directing the processor to perform an analog signal test operation based on one of the first and second test elements of the test procedure; and providing instructions directing the processor to perform a digital signal test operation based on another of the first and second test elements of the test procedure.

16. The method of claim 9, further comprising the steps of:
- analyzing the test procedure to identify which programmable input variables of the test elements of the test procedure require initial values; and
- creating a graphical user interface component which prompts a user to provide the required initial values to initialize the identified programmable input variables.

17. A method for providing a test procedure for testing a device, comprising the steps of:
- combining test elements from a test element database to form a test procedure such that (i) the test procedure defines a device testing task, (ii) the test procedure includes multiple test elements, and (iii) each test element defines instructions and programmable input variables that direct a processor to perform a particular test operation of the device testing task;
- setting at least a portion of the programmable input variables of each test element forming the test procedure to initial values;
- indicating an operating order for the test elements forming the test procedure; and
- storing the test procedure within a memory, wherein the step of indicating the operating order includes the step of:
- designating a first test element that directs the processor to perform a first test operation that generates a first test result ahead of a second test element that directs the processor to perform a second operation that (i) obtains the first test result generated by the first test operation performed by the processor under direction of the first test element, and (ii) generates a second test result based on the first test result.

18. The method of claim 13 further comprising the step of:
- nesting the test procedure within another test procedure.

19. The method of claim 13 wherein the device is a mixed signal device, and wherein the step of combining includes the steps of:
- incorporating one of the first and second test elements into the test procedure, the one of the first and second test elements defining instructions which direct the processor to perform an analog signal test operation; and
- incorporating another of the first and second test elements into the test procedure, the other of the first and second test elements defining instructions which direct the processor to perform a digital signal test operation.

20. The system of claim 1 wherein each test element of a set of test elements within the test procedure corresponds to a particular signal used by the device.

21. A system for testing a device, comprising:
- memory having a test application stored therein;
- a test interface to connect to a device; and
- a processor coupled to the memory and the test interface, the processor being configured to operate in accordance with the test application to:
  - i) provide a series of instructions based on a test procedure defining a device testing task, the test procedure including multiple test elements, each test element defining instructions and programmable input variables that direct the processor to perform a particular test operation of the device testing task, and
  - ii) control the test interface based on the provided series of instructions in order to test the device, wherein the test procedure includes:
- a first test element that directs the processor to perform a first test operation that generates a first test result; and
- a second test element that directs the processor to perform a second operation that (i) obtains the first test result generated by the first test operation performed by the processor under direction of the first test element, and (ii) generates a second test result based on the first test result.

22. A system for testing a device, comprising:
- memory having a test application stored therein;
- a test interface to connect to a device;
- a processor coupled to the memory and the test interface, the processor being configured to operate in accordance with the test application to:
  - i) provide a series of instructions based on a test procedure defining a device testing task, the test procedure including multiple test elements, each test element defining instructions and programmable input variables that direct the processor to perform a particular test operation of the device testing task, and
  - ii) control the test interface based on the provided series of instructions in order to test the device; and
- a test element database which stores a first test element having instructions that direct the processor to perform an analog signal operation, and a second test element having instructions that direct the processor to perform a digital signal operation, wherein the test procedure is configured to direct the processor to the first and second test elements to perform a mixed signal test based on the first and second test elements.

* * * * *

(12) EX PARTE REEXAMINATION CERTIFICATE (8532nd)
United States Patent
Kittross et al.

(10) Number: US 6,681,351 C1
(45) Certificate Issued: Sep. 13, 2011

(54) EASY TO PROGRAM AUTOMATIC TEST EQUIPMENT

(75) Inventors: Andrew W. Kittross, Beverly, MA (US); Allan M. Ryan, Billerica, MA (US)

(73) Assignee: Teradyne, Inc., North Reading, MA (US)

Reexamination Request:
No. 90/011,161, Aug. 17, 2010

Reexamination Certificate for:
Patent No.: 6,681,351
Issued: Jan. 20, 2004
Appl. No.: 09/417,034
Filed: Oct. 12, 1999

(51) Int. Cl.
*G11C 29/00* (2006.01)
*G06F 19/00* (2006.01)

(52) U.S. Cl. .................................. 714/724; 702/119
(58) Field of Classification Search .................. None
See application file for complete search history.

(56) References Cited

U.S. PATENT DOCUMENTS

| | | |
|---|---|---|
| 4,894,829 A | 1/1990 | Monie et al. |
| 5,206,582 A | 4/1993 | Ekstedt et al. |
| 5,892,949 A | 4/1999 | Noble |

FOREIGN PATENT DOCUMENTS

| | | |
|---|---|---|
| DE | 19713932 A1 | 10/1998 |
| WO | WO-9923499 A1 | 5/1999 |

OTHER PUBLICATIONS

International Preliminary Examination Report for International Application No. PCT/US00/28424 completed on Jan. 14, 2002. 8 pages.
International Search Report for PCT Application No. PCT/US00/28424 mailed Feb. 5, 2001. 3 pages.

*Primary Examiner* — M. Sager

(57) ABSTRACT

The invention is directed to techniques for providing a test procedure for testing a device using automatic test equipment (ATE). An ATE system includes memory having a test application stored therein, a test interface to connect to the device, and a processor coupled to the memory and the test interface. The processor is configured to operate in accordance with the test application to (i) provide a series of instructions based on a test procedure defining a device testing task, and (ii) control the test interface based on the provided series of instructions in order to test the device. The test procedure includes multiple test elements. Each test element defines instructions and programmable input variables that direct the processor to perform a particular test operation of the device testing task. The user of the ATE system combines test elements when creating the test procedure rather than write code from scratch, or modify code of pre-written templates. Accordingly, the user does not need to possess knowledge of a programming language or low-level ATE component details.

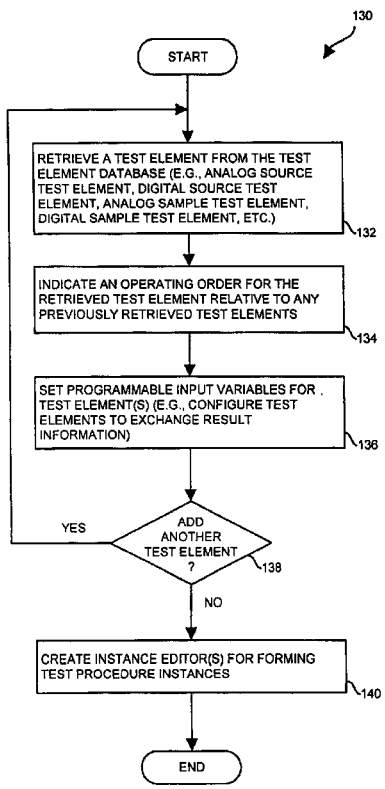

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 9 and 17 are cancelled.

Claims 5-6 and 13-14, dependent on an amended claim, are determined to be patentable.

New claims 23-31 are added and determined to be patentable.

Claims 2-4, 7-8, 10-12, 15-16 and 18-22 were not reexamined.

5. The system of claim [1] *26 or 29*, wherein the processor includes multiple processing units that are associated with respective multiple devices, and wherein each of the multiple processing units is configured to control a respective portion of the test interface based on the provided series of instructions to test the respective multiple devices in parallel.

6. The system of claim [1] *26 or 29*, wherein the processor includes multiple processing units that are associated with respective multiple devices, and wherein the multiple processing units are configured to control respective portions of the test interface based on instructions defined by a single instance of the test procedure to test the respective multiple devices in parallel.

13. The method of claim [9] *27 or 30* wherein the test interface includes multiple processing units that are associated with respective multiple devices, and wherein the step of controlling the test interface includes the steps of: operating each of the multiple processing units of the test interface based on the provided series of instructions to test each of the respective multiple devices in parallel.

14. The method of claim [9] *27 or 30* wherein the test interface includes multiple processing units that are associated with respective multiple devices, and wherein the step of controlling the test interface includes the steps of: operating the multiple processing units of the test interface based on instructions defined by a single instance of the test procedure to test each of the respective multiple devices in parallel.

*23. The system of claim 29, wherein the processor is further configured to operate in accordance with the test application to:*

*iii) propagate a change to a particular test element to a plurality of test procedures that include the particular test element, such that each test procedure referencing the changed test element automatically accesses the test element as changed.*

*24. The method of claim 30, further comprising the steps of:*

*propagating a change to a particular test element of the multiple test elements to the test procedure that includes the particular test element, such that each test procedure referencing the changed test element automatically accesses the test element as changed; and*

*providing a modified series of instructions based on the test procedure, the modified series of instructions reflecting the change to the particular test element.*

*25. The method of claim 31, further comprising the step of:*

*propagating a change to a particular test element of the multiple test elements to the test procedure that includes the particular test element, such that each test procedure referencing the changed test element automatically accesses the test element as changed.*

*26. A system for testing a device, and having instruments for testing comprising:*

*memory having a test application stored therein;*

*a test interface to connect to a device; and*

*a processor coupled to the memory and the test interface, the processor being configured to operate in accordance with the test application to:*

*i) provide a series of instructions based on a test procedure defining a device testing task, the test procedure including multiple test elements that are modularized, prewritten groupings of instructions and variables, wherein each test element embodies the basic functionality of one of the system's instruments, each test element defining instructions and programmable input variables that direct the processor to perform a particular test operation of the device testing task, the test elements being self-contained such that when combined into a test procedure, the test procedure is self contained in that the test procedure includes the instructions and variables necessary for the performing of a device testing task, and the groupings are for being retrieved at test procedure creation time; and*

*ii) control the test interface based on the provided series of instructions in order to test the device,*

*wherein each test element defines instructions for only a partial device testing task such that the multiple test elements together form a complete device testing task for testing the device.*

*27. A method for testing a device in a system having instruments for testing, comprising the steps of:*

*obtaining a test procedure which defines a device testing task, the test procedure including multiple test elements that are modularized, prewritten groupings of instructions and variables, each test element defining instructions and programmable input variables that direct a processor to perform a particular test operation of the device testing task, wherein each test element embodies the basic functionality of one of the system's instruments, the test elements being self-contained such that when combined into a test procedure, the test procedure is self contained in that the test procedure includes the instructions and variables necessary for the performing of a device testing task, and the groupings are for being retrieved at test procedure creation time;* providing a series of instructions based on the test procedure; and controlling a test interface based on the provided series of instructions in order to test the device, wherein the step of controlling the test interface includes the steps of:
based on a first test element, performing a first test operation that generates a first test result, and
based on a second test element, performing a second test operation that (i) obtains the first test result generated by the first test operation performed by the processor under direction of the first test element, and (ii) generates a second test result based on the first test result.

28. A method for providing a test procedure for testing a device in a system having instruments for testing, comprising the steps of:
combining test elements that are modularized, prewritten groupings of instructions and variables from a test element database to form a test procedure such that (i) the test procedure defines a device testing task, (ii) the test procedure includes multiple test elements, and (iii) each test element defines instructions and programmable input variables that direct a processor to perform a particular test operation of the device testing task, wherein each test element embodies the basic functionality of one of the system's instruments, the test elements being self-contained such that when combined into a test procedure, the test procedure is self contained in that the test procedure includes the instructions and variables necessary for the performing of a device testing task, and the groupings are for being retrieved at test procedure creation time;
setting at least a portion of the programmable input variables of each test element forming the test procedure to initial values;
indicating an operating order for the test elements forming the test procedure; and
storing the test procedure within a memory,
wherein the step of indicating the operating order includes the step of:
designating a first test element that directs the processor to perform a first test operation that generates a first test result ahead of a second test element that directs the processor to perform a second operation that (i) obtains the first test result generated by the first test operation performed by the processor under direction of the first test element, and (ii) generates a second test result based on the first test result;
wherein the test procedure has user-entered pointers to test elements in the database and variable values.

29. A system for testing a device having instruments for testing, comprising:
memory having a test application stored therein;
a test interface to connect to a device; and
a processor coupled to the memory and the test interface, the processor being configured to operate in accordance with the test application to:
i) provide a series of instructions based on a test procedure defining a device testing task, the test procedure including multiple test elements, each test element defining instructions and programmable input variables that direct the processor to perform a particular test operation of the device testing task, and
ii) control the test interface based on the provided series of instructions in order to test the device,
wherein each test element defines instructions for only a partial device testing task such that the multiple test elements together form a complete device testing task for testing the device, wherein the test elements are modularized, prewritten groupings of instructions and variables, wherein each test element embodies the basic functionality of one of the system's instruments, wherein the test procedure has user-entered pointers to test elements in the database and variable values, the groupings for being retrieved at device testing time.

30. A method for testing a device in a system having instruments for testing, comprising the steps of:
obtaining a test procedure which defines a device testing task, the test procedure including multiple test elements, each test element defining instructions and programmable input variables that direct a processor to perform a particular test operation of the device testing task;
providing a series of instructions based on the test procedure; and
controlling a test interface based on the provided series of instructions in order to test the device, wherein the step of controlling the test interface includes the steps of:
based on a first test element, performing a first test operation that generates a first test result, and
based on a second test element, performing a second test operation that (i) obtains the first test result generated by the first test operation performed by the processor under direction of the first test element, and (ii) generates a second test result based on the first test result;
wherein the test elements are modularized, prewritten groupings of instructions and variables, wherein each test element embodies the basic functionality of one of the system's instruments, wherein the test procedure has user-entered pointers to test elements in the database and variable values, the groupings for being retrieved at device testing time.

31. A method for providing a test procedure for testing a device in a system having instruments for testing, comprising the steps of:
combining test elements from a test element database to form a test procedure such that (i) the test procedure defines a device testing task, (ii) the test procedure includes multiple test elements, and (iii) each test element defines instructions and programmable input variables that direct a processor to perform a particular test operation of the device testing task;
setting at least a portion of the programmable input variables of each test element forming the test procedure to initial values;
indicating an operating order for the test elements forming the test procedure; and
storing the test procedure within a memory,
wherein the step of indicating the operating order includes the step of:
designating a first test element that directs the processor to perform a first test operation that generates a first test result ahead of a second test element that directs the processor to perform a second operation that (i) obtains the first test result generated by the first test operation performed by the processor under direction

*of the first test element, and (ii) generates a second test result based on the first test result;*

*wherein the test elements are modularized, prewritten groupings of instructions and variables, wherein each test element embodies the basic functionality of one of the system's instruments, wherein the test procedure has user-entered pointers to test elements in the database and variable values, the groupings for being retrieved at device testing time.*

\* \* \* \* \*